(12) United States Patent
Yang

(10) Patent No.: US 11,527,742 B2
(45) Date of Patent: Dec. 13, 2022

(54) ORGANIC LIGHT EMITTING DIODE DISPLAY PANEL AND DISPLAY DEVICE HAVING EXTINCTION STRUCTURE

(71) Applicant: WUHAN CHINA STAR OPTOELECTRONICS SEMICONDUCTOR DISPLAY TECHNOLOGY CO., LTD., Wuhan (CN)

(72) Inventor: Hanning Yang, Wuhan (CN)

(73) Assignee: WUHAN CHINA STAR OPTOELECTRONICS SEMICONDUCTOR DISPLAY TECHNOLOGY CO., LTD., Wuhan (CN)

(*) Notice: Subject to any disclaimer, the term of this patent is extended or adjusted under 35 U.S.C. 154(b) by 207 days.

(21) Appl. No.: 16/771,584

(22) PCT Filed: Jan. 9, 2020

(86) PCT No.: PCT/CN2020/071200
§ 371 (c)(1),
(2) Date: Jun. 10, 2020

(87) PCT Pub. No.: WO2021/036168
PCT Pub. Date: Mar. 4, 2021

(65) Prior Publication Data
US 2021/0408502 A1 Dec. 30, 2021

(30) Foreign Application Priority Data
Aug. 29, 2019 (CN) .......................... 201910808773.5

(51) Int. Cl.
*H01L 51/52* (2006.01)
*H01L 27/32* (2006.01)

(52) U.S. Cl.
CPC ........ *H01L 51/5293* (2013.01); *H01L 27/322* (2013.01)

(58) Field of Classification Search
None
See application file for complete search history.

(56) References Cited

U.S. PATENT DOCUMENTS

2006/0055848 A1* 3/2006 Kim ..................... G02B 5/3083
349/107
2007/0077502 A1* 4/2007 Moriya ............. G02F 1/133514
430/7

(Continued)

FOREIGN PATENT DOCUMENTS

CN 105870148 A 8/2016
CN 107482037 A 12/2017

(Continued)

*Primary Examiner* — Nduka E Ojeh
(74) *Attorney, Agent, or Firm* — PV IP PC; Wei Te Chung; Ude Lu

(57) ABSTRACT

An organic light emitting diode display panel and a display device are provided. The display panel includes a display substrate and a phase functional layer disposed on the display substrate. The display substrate includes a plurality of pixel units. The phase functional layer includes a plurality of phase retardation layers. Each of the phase retardation layers is disposed corresponding to one of the pixel units. The phase retardation layer is configured to convert a linearly polarized light passing therethrough into a circularly polarized light. The display panel and the display device have good anti-reflective performance, so that a displayed image is not disturbed by external light and has high definition. Also, it is beneficial to realize a thin and light design of the display panel and display device.

18 Claims, 4 Drawing Sheets

(56) References Cited

U.S. PATENT DOCUMENTS

| | | | |
|---|---|---|---|
| 2014/0097412 A1* | 4/2014 | Kuo | H01L 27/3211 257/40 |
| 2016/0233273 A1 | 8/2016 | Ohyama et al. | |
| 2017/0357120 A1 | 12/2017 | Kim et al. | |
| 2019/0027541 A1 | 1/2019 | Zha | |

FOREIGN PATENT DOCUMENTS

| | | | | |
|---|---|---|---|---|
| CN | 207529935 U | | 6/2018 | |
| CN | 110600514 A | | 12/2019 | |
| TW | M458676 U | * | 8/2012 | H01L 51/50 |
| TW | M458676 U | | 8/2013 | |

* cited by examiner

ORGANIC LIGHT EMITTING DIODE DISPLAY PANEL AND DISPLAY DEVICE HAVING EXTINCTION STRUCTURE

CROSS REFERENCE TO RELATED APPLICATIONS

This application claims the priority of a Chinese Patent Application No. 201910808773.5, filed on Aug. 29, 2019, titled "ORGANIC LIGHT EMITTING DIODE DISPLAY PANEL AND DISPLAY DEVICE", the entire contents of which are incorporated herein by reference.

FIELD OF DISCLOSURE

The present disclosure relates to the field of display technologies, and in particular, to an organic light emitting diode display panel and a display device.

BACKGROUND

With a development of science and technology and an increase of people's requirements for products, flexible displays are more and more valued and favored by a market. In comparison with liquid crystal display panels, organic light emitting diode display panels have a structural advantage of being flexible displays. Therefore, major panel manufacturers have put more effort into a research and development of flexible organic light emitting diode displays.

A thickness of a display will have a greater impact on flexible characteristics of the display. The thinner the thickness of the display, the better it is to realize its flexible characteristics. Currently, in order to eliminate a reflection effect of a display screen on external light, a polarizer is provided on a display surface of the display screen. The polarizer is a composite film composed of multiple layers of organic materials. It includes at least one phase retardation layer, one linearly polarized light layer, and multiple protective films. Therefore, it has a large thickness, which is not conducive to a thin design of the display screen. In addition, the phase retardation layer in the currently polarizer have an integral structure. A retardation coefficient of the phase retardation layer of this integral structure cannot meet phase requirements of entire visible wavelengths. Therefore, some of light cannot be converted from a linearly polarized light to a circularly polarized light by the phase retardation layer. This part of the light cannot be extinction by a linearly polarized light layer after being reflected by a cathode, causing light leakage, which seriously reduces an anti-reflection ability of the display screen.

SUMMARY OF DISCLOSURE

In the prior art, a thickness of a polarizer is large, which is not conducive to achieving a thin and light design of a display screen. Also, a retardation coefficient of the phase retardation layer of this integral structure cannot meet phase requirements of entire visible wavelengths. Therefore, some of light cannot be converted from a linearly polarized light to a circularly polarized light by the phase retardation layer. This part of the light cannot be extinction by a linearly polarized light layer after being reflected by a cathode, causing light leakage, which seriously reduces an anti-reflection ability of the display screen.

In order to solve the above technical problems, technical solutions provided by the present disclosure are as follows.

The present disclosure provides an organic light emitting diode display panel, including a display substrate and a phase functional layer.

The display substrate includes a plurality of pixel units, and at least some of the pixel units have different colors.

The phase functional layer is disposed on a display surface of the display substrate and includes a plurality of phase retardation layers, each of the phase retardation layers is disposed corresponding to one of the pixel units, and the phase retardation layers are configured to convert light having a linearly polarized light to a circularly polarized light.

In the organic light emitting diode display panel of the present disclosure, the phase retardation layers are configured to retard a phase of the light passing therethrough by a quarter wavelength.

In the organic light emitting diode display panel of the present disclosure, thicknesses of the phase retardation layers corresponding to the pixel units of different colors are different.

In the organic light emitting diode display panel of the present disclosure, a thickness of one of the phase retardation layers is less than 10 micrometers.

In the organic light emitting diode display panel of the present disclosure, the phase functional layer further includes a first barrier disposed between two adjacent phase retardation layers, and the first barrier is configured to prevent light passing through one of the two adjacent phase retardation layers from entering another one of the two adjacent phase retardation layers.

In the organic light emitting diode display panel of the present disclosure, the first barrier is made of an opaque material, and a thickness of the first barrier is greater than a thickness of one of the phase retardation layers.

In the organic light emitting diode display panel of the present disclosure, the organic light emitting diode display panel further includes an optical functional layer disposed on the phase functional layer, the optical functional layer includes a plurality of polarizing units, each of the polarizing units is disposed corresponding to one of the pixel units, and each of the polarizing unit is configured to convert light passing therethrough into a linearly polarized light with a color the same as that of a corresponding pixel unit.

In the organic light emitting diode display panel of the present disclosure, each of the polarizing units includes a linearly polarized light layer disposed on the phase functional layer and a color filter layer disposed on the linearly polarized light layer, and the color filter layer is configured to filter light passing therethrough into monochromatic light with a color the same as that of a corresponding pixel unit, and the linearly polarized light layer is configured to convert light passing therethrough into the linearly polarized light.

In the organic light emitting diode display panel of the present disclosure, each of the polarizing units includes a color filter layer disposed on the phase functional layer and a linearly polarized light layer disposed on the color filter layer, and the color filter layer is configured to filter light passing therethrough into monochromatic light with a color the same as that of a corresponding pixel unit, and the linearly polarized light layer is configured to convert light passing therethrough into the linearly polarized light.

In the organic light emitting diode display panel of the present disclosure, the optical functional layer further includes a second barrier disposed between two adjacent polarizing units, and the second barrier is configured to prevent light passing through one of the two adjacent polarizing units from entering another one of the two adjacent polarizing units.

In the organic light emitting diode display panel of the present disclosure, the second barrier is made of an opaque material, and a thickness of the second barrier is greater than a thickness of one of the polarizing units.

In the organic light emitting diode display panel of the present disclosure, the display substrate includes a red pixel unit, a green pixel unit, and a blue pixel unit, and the phase functional layer includes a red phase retardation layer corresponding to the red pixel unit, a green phase retardation layer corresponding to the green pixel unit, and a blue phase retardation layer corresponding to the blue pixel unit.

In the organic light emitting diode display panel of the present disclosure, a thickness of the red phase retardation layer, a thickness of the green phase retardation layer, and a thickness of the blue phase retardation layer are different.

In the organic light emitting diode display panel of the present disclosure, the optical functional layer includes a red polarizing unit corresponding to the red pixel unit, a green polarizing unit corresponding to the green pixel unit, and a blue polarizing unit corresponding to the blue pixel unit.

In the organic light emitting diode display panel of the present disclosure, a thickness of the red polarizing unit, a thickness of the green polarizing unit, and a thickness of the blue polarizing unit are different.

In the organic light emitting diode display panel of the present disclosure, the organic light emitting diode display panel further includes a first planarization layer, a touch functional layer, a second planarization layer, and a cover plate. The first planarization layer is disposed on the phase functional layer, the touch functional layer is disposed between the first planarization layer and the optical functional layer, the second planarization layer is disposed on the optical functional layer, and the cover plate is disposed on the second planarization layer.

In the organic light emitting diode display panel of the present disclosure, the display substrate further includes a flexible substrate, an array layer disposed on the flexible substrate, and a thin film encapsulation layer disposed on the pixel units. The pixel units are disposed between the array layer and the thin film encapsulation layer.

The present disclosure also provides a display device, including an organic light emitting diode display panel. The organic light emitting diode display panel includes a display substrate and a phase functional layer.

The display substrate includes a plurality of pixel units, and at least some of the pixel units have different colors.

The phase functional layer is disposed on a display surface of the display substrate and includes a plurality of phase retardation layers. Each of the phase retardation layers is disposed corresponding to one of the pixel units, and the phase retardation layers are configured to convert light having a linearly polarized light to a circularly polarized light.

In the display device of the present disclosure, the organic light emitting diode display panel further includes an optical functional layer disposed on the phase functional layer, the optical functional layer includes a plurality of polarizing units, each of the polarizing units is disposed corresponding to one of the pixel units, and each of the polarizing unit is configured to convert light passing therethrough into a linearly polarized light with a color the same as that of a corresponding pixel unit.

In the display device of the present disclosure, the display substrate includes a red pixel unit, a green pixel unit, and a blue pixel unit.

The phase functional layer includes a red phase retardation layer corresponding to the red pixel unit, a green phase retardation layer corresponding to the green pixel unit, and a blue phase retardation layer corresponding to the blue pixel unit.

The optical functional layer includes a red polarizing unit corresponding to the red pixel unit, a green polarizing unit corresponding to the green pixel unit, and a blue polarizing unit corresponding to the blue pixel unit.

The present disclosure provides an organic light emitting diode display panel and a display device. By setting respectively phase retardation layer and polarizing unit on each pixel unit, it can achieve an extinction of incident light in a single pixel area, greatly reduce a probability of reflected light leakage, and improve an anti-reflective ability of the display panel. In comparison with a conventional polarizer structure, an extinction structure provided in embodiments of the present disclosure has a smaller thickness, which is beneficial to a realization of the thin and light design of the display panel and the display device.

BRIEF DESCRIPTION OF DRAWINGS

In order to explain technical solutions in embodiments of the present disclosure more clearly, drawings used in the description of the embodiments will be briefly introduced below. Apparently, the drawings in the following description are just some embodiments of the present disclosure. For those skilled in the art, other drawings can be obtained based on these drawings without creative efforts.

DETAILED DESCRIPTION

Figure 1:
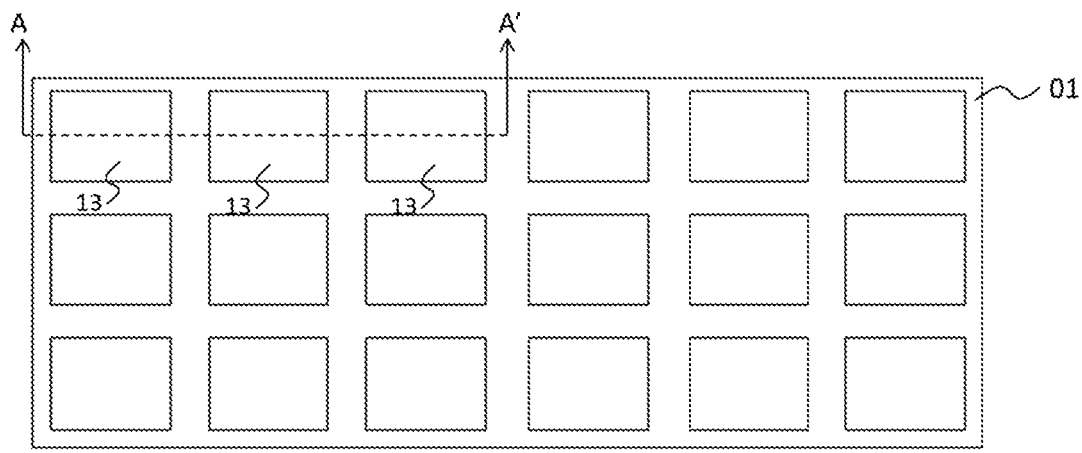
FIG. 1 is a schematic diagram of an arrangement structure of pixel units in an organic light emitting diode display panel of an embodiment of the present disclosure.

The foregoing objects, features, and advantages adopted by the present disclosure can be best understood by referring to the following detailed description of the preferred embodiments and the accompanying drawings. Furthermore, the directional terms described in the present disclosure, such as upper, lower, front, rear, left, right, inside, outer, side, etc., are only directions with reference to the accompanying drawings, so that the used directional terms are used to describe and understand the present disclosure, but the present disclosure is not limited thereto. In the drawings, units with similar structures use the same numerals.

An embodiment of the present disclosure provides an organic light emitting diode display panel. By setting respectively phase retardation layer and polarizing unit on each pixel unit, it can reduce an overall thickness of the display panel and improve an anti-reflective ability of the display panel.

Figure 2:
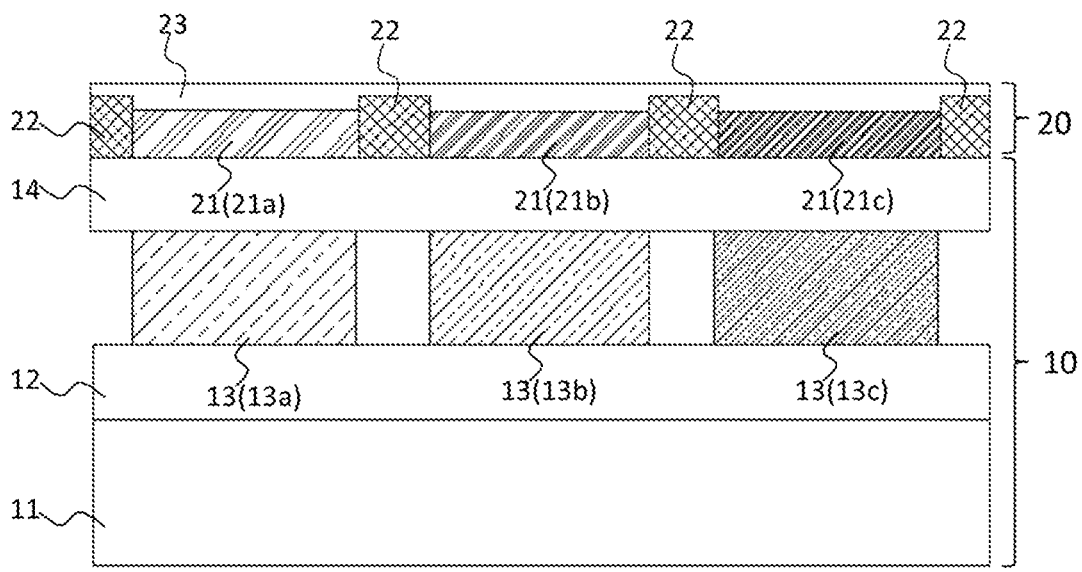
FIG. 2 is a first cross-sectional view illustrating the organic light emitting diode display panel taken along line A-A' in FIG. 1.

Referring to FIG. 1 and FIG. 2. FIG. 1 is a schematic diagram of an arrangement structure of pixel units in a display panel of an embodiment of the present disclosure. FIG. 2 is a cross-sectional view illustrating the display panel taken along line A-A' in FIG. 1. The organic light emitting diode display panel 01 of the embodiment of the present disclosure includes a display substrate 10 and a phase functional layer 20.

The display substrate 10 includes a plurality of pixel units 13 arranged in an array. At least some of the pixel units 13 have different colors. Alternatively, the pixel units 13 include a red pixel unit 13a, a green pixel unit 13b, and a blue pixel unit 13c. The red pixel unit 13a, the green pixel unit 13b, and the blue pixel unit 13c are alternately arranged. It should be understood that the red pixel unit 13a may independently emit red light, the green pixel unit 13b may independently emit green light, and the blue pixel unit 13c may independently emit blue light. The organic light emitting diode display panel 01 can display an image under the light emission of the red pixel unit 13a, the green pixel unit 13b, and the blue pixel unit 13c.

Alternatively, each of the pixel units 13 includes a cathode layer, a pixel definition layer, and an anode layer. The pixel definition layer may emit monochromatic light. It should be noted that the color of the light emitted by the pixel definition layer is a pixel color of a corresponding pixel unit 13. The cathode layer is made of opaque metal, and it can reflect the light emitted by the pixel definition layer or the light from an outside toward the cathode layer to a light emitting surface of the display panel 01.

Alternatively, the display substrate 10 further includes a flexible substrate 11, an array layer 12 disposed on the flexible substrate 11, and a thin film encapsulation layer 14 disposed on the pixel units 13. The pixel units 13 are disposed between the array layer 12 and the thin film encapsulation layer 14. The flexible substrate 11 may be a polyimide substrate. The array layer 12 includes a plurality of thin film transistors arranged in an array and a wiring structure. The array layer 12 and the pixel units 13 have an electrical connection relationship. The array layer 12 is configured to control a light emitting function of the pixel units 13. The thin film encapsulation layer 14 is made of an organic material and is configured to seal and protect the pixel units 13

It should be noted that a surface of the display substrate 10 having a display screen function is a display surface. Alternatively, the display substrate 10 may have a plurality of display surfaces. For example, if two opposite sides of the display substrate 10 have a display screen function, the display substrate 10 has two display surfaces.

The phase functional layer 20 is disposed on the display surface of the display substrate 10. The phase functional layer 20 is configured to convert light incident from the display surface of the display substrate 10 into an interior of the display substrate into a circularly polarized light. Specifically, the phase functional layer 20 includes a plurality of phase retardation layers 21. Each of the phase retardation layers 21 is disposed corresponding to one of the pixel units 13. That is, the phase retardation layers 21 are arranged in one-to-one correspondence with the pixel units 13, and are arranged in an array as well as the pixel units 13. It should be understood that light from outside to the pixel units 13 need to pass through the phase retardation layers 21 first. The phase retardation layers 21 can adjust a propagation state of the light by changing a phase of the light. Alternatively, the phase retardation layers 21 may retard the phase of the light by a quarter wavelength. If the incident light is a linearly polarized light, the incident light is converted into a circularly polarized light after passing through the phase retardation layers 21. Therefore, the phase retardation layers 21 have a characteristic of converting the light passing therethrough from the linearly polarized light to the circularly polarized light.

Alternatively, a phase retardation layer 21 corresponding to one pixel unit 13 may adjust the phase of light of the same color as the pixel unit, and the phase retardation layers 21 corresponding to the pixel units of different colors have different thicknesses. It should be understood that different colors of light have different wavelengths. Therefore, the phase retardation layers corresponding to different light colors should have different ability to adjust the phase of light. The ability of phase retardation layers to adjust the phase of light is related to the thickness and material of the phase retardation layers. When the phase retardation layers are all made of the same material, the phase retardation layers corresponding to different colors have different thicknesses.

Alternatively, the phase retardation layers 21 are made of a liquid crystal material or other anisotropic organic material, and the thicknesses of the phase retardation layers 21 are within 10 micrometers.

Alternatively, when the pixel units 13 have three pixel colors of red, green, and blue, the phase retardation layers 21 include a red phase retardation layer 21a corresponding to the red pixel unit 13a, a green phase retardation layer 21b corresponding to the green pixel unit 13b, and a blue phase retardation layer 21c corresponding to the blue pixel unit 13c. The red phase retardation layer 21a can adjust a phase of a red linearly polarized light passing therethrough to convert the red linearly polarized light into a red circularly polarized light. The green phase retardation layer 21b can adjust a phase of a green linearly polarized light passing therethrough to convert the green linearly polarized light into a green circularly polarized light. The blue phase retardation layer 21c can adjust a phase of a blue linearly polarized light passing therethrough to convert the blue linearly polarized light into a blue circularly polarized light.

Alternatively, thicknesses of the red phase retardation layer 21a, the green phase retardation layer 21b, and the blue phase retardation layer 21c are different. The thicknesses of the red phase retardation layer 21a, the green phase retardation layer 21b, and the blue phase retardation layer 21c are all within 10 micrometers.

Furthermore, the phase functional layer 20 further includes a first barrier 22 disposed between two adjacent phase retardation layers 21. The first barrier 22 is configured to prevent the light passing through one of the two adjacent phase retardation layers 21 from entering another one of the two adjacent phase retardation layers 21, so as to prevent a crosstalk between the lights in different phase retardation layers 21. Alternatively, the first barrier 22 is made of an opaque material. A thickness of the first barrier 22 is slightly greater than a thickness of one of the phase retardation layers 21.

Furthermore, the phase functional layer 20 further includes a first planarization layer 23 disposed on the phase retardation layers 21 and the first barrier 22. The first planarization layer 23 completely covers the phase retardation layers 21 and the first barrier 22. The first planarization layer 23 enables the phase functional layer 20 to have a flat surface, so that other components are disposed on the phase functional layer 20.

Figure 3:
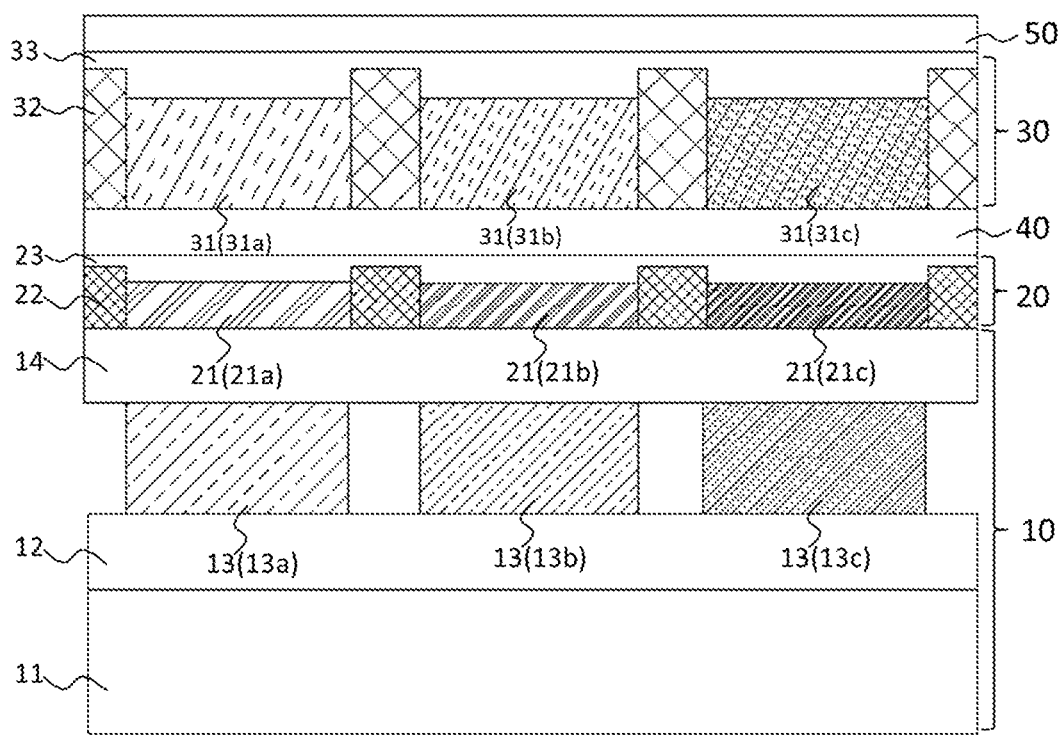
FIG. 3 is a second cross-sectional view illustrating the organic light emitting diode display panel taken along line A-A' in FIG. 1.

Furthermore, referring to FIG. 1 and FIG. 3. FIG. 3 is another cross-sectional view illustrating the organic light emitting diode display panel taken along line A-A' in FIG. 1. The organic light emitting diode display panel 01 further includes a touch functional layer 40 disposed on a phase functional layer 20 and an optical functional layer 30 disposed on the touch functional layer 40. The touch functional layer 40 is configured to implement a touch function of the organic light emitting diode display panel 01. Alternatively, the organic light emitting diode display panel 01 may not include the touch functional layer 40. If the organic light emitting diode display panel 01 does not include the touch functional layer 40, the optical functional layer 30 is directly disposed on the phase functional layer 20.

The optical functional layer 30 is configured to transform light passing through it into a linearly polarized light with a specific color. Specifically, the optical functional layer 30 includes a plurality of polarizing units 31, and each of the polarizing units 31 is disposed corresponding to one of pixel units 13. Therefore, the polarizing units 31 have the same array arrangement feature as the pixel units 13. Each of the polarizing units 31 is configured to convert the light passing therethrough into the linearly polarized light as the same color of the pixel unit 13 corresponding thereto. Specifically, when external light is irradiated onto the polarizing unit 31, the polarizing unit 31 may filter the external light into monochromatic light. Also, the color of the monochromatic light is the same as the color of the pixel unit 13 corresponding to the polarizing unit 31. The polarizing unit 31 converts the monochromatic light into the linearly polarized light. The light passing through the polarizing unit 31 is directed toward the pixel unit 13 through the phase retardation layer 21.

It should be understood that the external light is converted to a monochrome linearly polarized light after passing through the polarizing unit 31, and then the monochrome linearly polarized light is converted to a monochrome circularly polarized light after passing through the phase retardation layer 21. The monochromatic circularly polarized light is reflected by a cathode of the pixel unit 13 and passes through the phase retardation layer 21 again, thereby converting the monochromatic circularly polarized light into the monochromatic linearly polarized light with a phase retardation. A polarization direction of the monochrome linearly polarized light is perpendicular to a polarization direction of the monochromatic linearly polarized light formed after passing through the polarizing unit 31 for the first time, so that the monochrome linearly polarized light cannot pass through the polarizing units 31, thereby achieving extinction.

Alternatively, the pixel units 13 include a red pixel unit 13a, a green pixel unit 13b, and a blue pixel unit 13c. The phase retardation layers 21 include a red phase retardation layer 21a corresponding to the red pixel unit 13a, a green phase retardation layer 21b corresponding to the green pixel unit 13b, and a blue phase retardation layer 21c corresponding to the blue pixel unit 13c. The polarizing units 31 include a red polarizing unit 31a corresponding to the red pixel unit 13a, a green polarizing unit 31b corresponding to the green pixel unit 13b, and a blue polarizing unit 31c corresponding to the blue pixel unit 13c. The red polarizing unit 31a is configured to convert light passing through it to a red linearly polarized light, the green polarizing unit 31b is configured to convert light passing through it to a green linearly polarized light, and the blue polarizing unit 31c is configured to convert light passing through it to a green linearly polarized light.

Alternatively, thicknesses of the red polarizing unit 31a, the green polarizing unit 31b, and the blue polarizing unit 31c are different, so as to meet the difference in the ability of different polarizing units to adjust the light of different colors. For example, a thickness of the red polarizing unit 31a is greater than a thickness of the green polarizing unit 31b, to meet a requirement of the red polarizing unit 31a to convert an incident light to the red linearly polarized light. A thickness of the green polarizing unit 31b is greater than that of the blue polarizing unit 31c, to meet a requirement of the blue polarizing unit 31c to convert an incident light into the blue linearly polarized light.

Furthermore, the optical functional layer 30 further includes a second barrier 32 disposed between two adjacent polarizing units 31. The second barrier 32 is configured to prevent the light passing through one of the two adjacent polarizing units 31 from entering another one of the two adjacent polarizing units 31, so as to prevent a crosstalk between lights in different polarizing units 31. Alternatively, the second barrier 32 is made of an opaque material, and a thickness of the second barrier 32 is slightly larger than a thickness of one of the polarizing units 31.

Furthermore, the optical functional layer 30 further includes a second planarization layer 33 disposed on the polarizing units 31 and the second barrier 32. The second planarization layer 33 completely covers the polarizing units 31 and the second barrier 32. The second planarization layer 33 enables the optical functional layer 30 to have a flat surface. Alternatively, a glass cover plate 50 is disposed on the second planarization layer 33, and the glass cover plate 50 is configured to prevent the optical functional layer 30 from being worn or damaged. The second planarization layer 33 and the glass cover plate 50 are both made of a transparent material.

In the embodiment of the present disclosure, by setting independent phase retardation layer and polarizing unit on each pixel unit, extinction of incident light in a single pixel region can be achieved, thereby greatly reducing a probability of light leakage, and improving an anti-reflection capability of the display panel. At the same time, in comparison to a conventional polarizer structure, the extinction structure of the embodiment of the present disclosure has a smaller thickness, which is beneficial to realize a thin and light design of the display panel.

Figure 4:
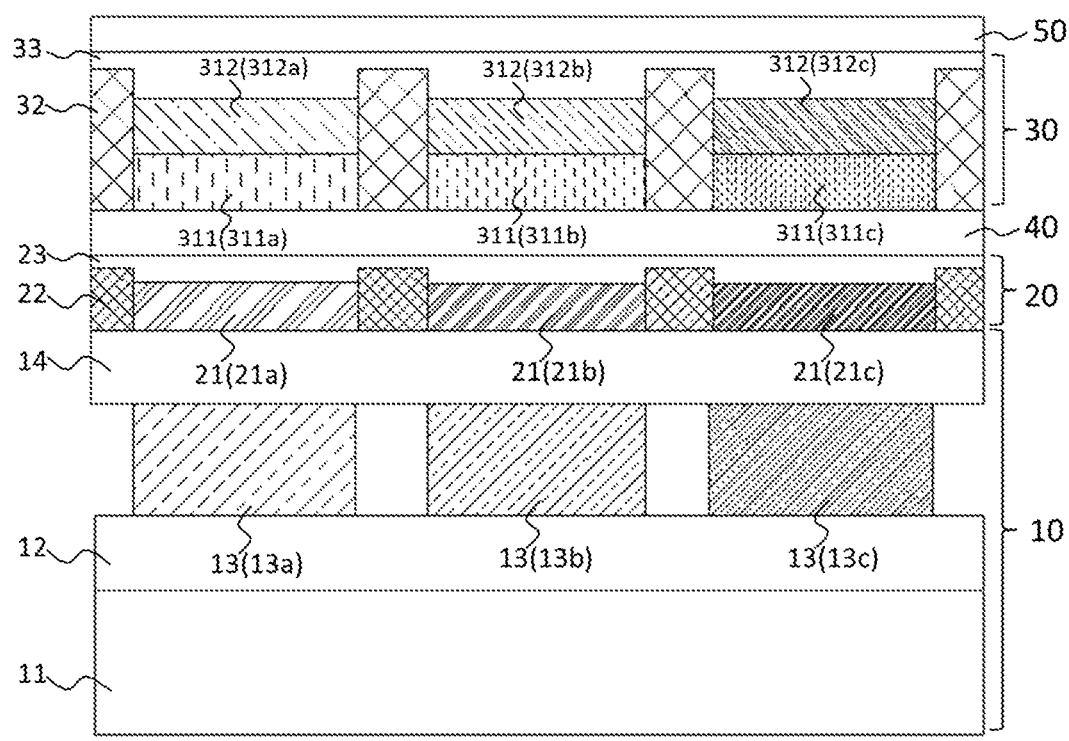
FIG. 4 is a third cross-sectional view illustrating the organic light emitting diode display panel taken along line A-A' in FIG. 1.

According to an embodiment of the present disclosure, as shown in FIG. 3 and FIG. 4, each of the polarizing units 31 includes a linearly polarized light layer 311 disposed on the touch functional layer 40 and a color filter layer 312 disposed on the linearly polarized light layer 311. Alternatively, if the organic light emitting diode display panel does not include the touch functional layer 40, the linearly polarized light layer 311 is directly disposed on the phase functional layer 20.

The color filter layer 312 is configured to filter light, and the light passing through it can be filtered into a monochromatic light with a color the same as that of the pixel unit 13 corresponding thereto. The linearly polarized light layer 311 is configured to convert light passing through it into the linearly polarized light. Therefore, when external light sequentially passes through the filter layer 312 and the linearly polarized light layer 311, it will be converted into the monochrome linearly polarized light, thereby achieving the function of the polarizing units 31.

Alternatively, if the pixel units 13 include a red pixel unit 13a, a green pixel unit 13b, and a blue pixel unit 13c, the polarizing units 31 include a red polarizing unit 31a corresponding to the red pixel unit 13a, and a green polarizing unit 31b corresponding to the green pixel unit 13b, and a blue polarizing unit 31c corresponding to the blue pixel unit 13c. The red polarizing unit 31a includes a red color filter layer 312a and a red linearly polarized light layer 311a. The red color filter layer 312a is configured to convert light passing through it into red light. The red linearly polarized light layer 311a is used to convert the red light passing through it to a red linearly polarized light. The green polarizing unit 31b includes a green color filter layer 312b and a green linearly polarized light layer 311b. The green color filter layer 312b is configured to convert light passing through it into green light. The green linearly polarized light layer 311b is configured to convert the green light passing through it into a green linearly polarized light. The blue polarizing unit 31c includes a blue color filter layer 312c and a blue linearly polarized light layer 311c. The blue color filter layer 312c is configured to convert light passing through it into blue light. The blue linearly polarized light layer 311c is configured to convert the blue light passing through it into a blue linearly polarized light.

It should be understood that the external light sequentially passes through the color filter layer 312 and the linearly polarized light layer 311 and converts to a monochrome linearly polarized light, and then the monochrome linearly polarized light passes through the phase retardation layer 21 and then converts to a monochrome circularly polarized light. The monochromatic circularly polarized light is reflected by a cathode in the pixel unit 13 and passes through the phase retardation layer 21 again, thereby converting the monochromatic circularly polarized light into a monochromatic linearly polarized light with a phase retardation. A polarization direction of the monochrome linearly polarized light is perpendicular to a polarization direction of the monochromatic linearly polarized light formed after passing through the linearly polarized light layer 311 for the first time, so that the monochrome linearly polarized light cannot pass through the linearly polarized light layer 311, thereby achieving extinction.

Figure 5:
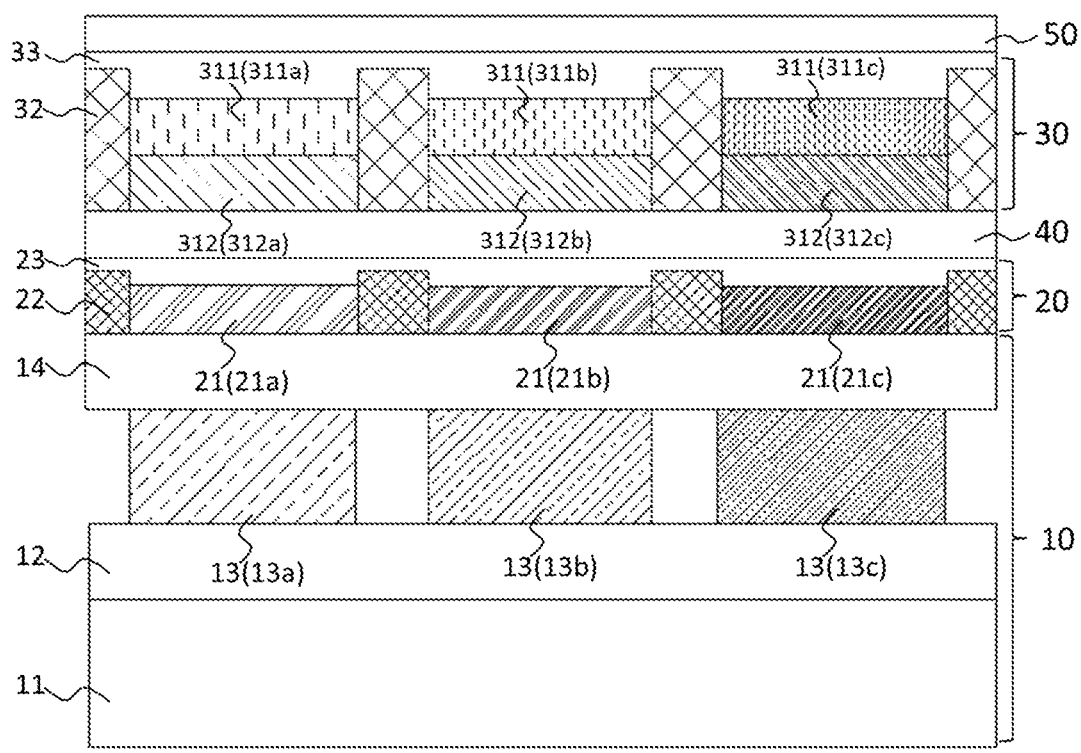
FIG. 5 is a fourth cross-sectional view illustrating the organic light emitting diode display panel taken along line A-A' in FIG. 1.

According to an embodiment of the present disclosure, as shown in FIG. 3 and FIG. 5, each of the polarizing units 31 includes a color filter layer 312 disposed on the touch functional layer 40 and a linearly polarized light layer 311 disposed on the color filter layer 312. Alternatively, if the organic light emitting diode display panel does not include the touch functional layer 40, the color filter layer 312 is directly disposed on the phase functional layer 20.

The linearly polarized light layer 311 is configured to convert light passing through it into a linearly polarized light. The color filter layer 312 is configured to filter the light passing through it into a monochromatic light with a color the same as that of a pixel unit 13 corresponding thereto. Therefore, if an external light sequentially passes through the linearly polarized light layer 311 and the filter layer 312, the external light will be converted into a monochrome linearly polarized light, thereby achieving a function of the polarizing unit 31.

Alternatively, if the pixel units 13 include a red pixel unit 13a, a green pixel unit 13b, and a blue pixel unit 13c, the polarizing units 31 include a red polarizing unit 31a corresponding to the red pixel unit 13a, and a green polarizing unit 31b corresponding to the green pixel unit 13b, and a blue polarizing unit 31c corresponding to the blue pixel unit 13c. The red polarizing unit 31a includes a red color filter layer 312a and a red linearly polarized light layer 311a. The red linearly polarized light layer 311a is configured to convert light passing through it into a linearly polarized light. The red color filter layer 312a is configured to convert the linearly polarized light passing through it to a red linearly polarized light. The green polarizing unit 31b includes a green color filter layer 312b and a green linearly polarized light layer 311b. The green linearly polarized light layer 311b is configured to convert light passing through it into a linearly polarized light. The green color filter layer 312b is configured to convert the linearly polarized light passing through it into a green linearly polarized light. The blue polarizing unit 31c includes a blue color filter layer 312c and a blue linearly polarized light layer 311c. The blue linearly polarized light layer 311c is configured to convert light passing through it into a linearly polarized light. The blue linearly polarized light layer 311c is configured to convert the linearly polarized light passing through it into a blue linearly polarized light.

It should be understood that the external light sequentially passes through the linearly polarized light layer 311 and the color filter layer 312 and converts to a monochrome linearly polarized light, and then the monochrome linearly polarized light passes through the phase retardation layer 21 and then converts to a monochrome circularly polarized light. The monochromatic circularly polarized light is reflected by a cathode in the pixel unit 13 and passes through the phase retardation layer 21 again, thereby converting the monochromatic circularly polarized light into a monochromatic linearly polarized light with a phase retardation. A polarization direction of the monochrome linearly polarized light is perpendicular to a polarization direction of the monochromatic linearly polarized light formed after passing through the color filter layer 312 for the first time, so that the monochrome linearly polarized light cannot pass through the linearly polarized light layer 311, thereby achieving extinction.

In the organic light emitting diode display panel of the embodiment of the present disclosure, by setting independent phase retardation layer and polarizing unit on each pixel unit, extinction of incident light in a single pixel region can be achieved, thereby greatly reducing a probability of light leakage, and improving an anti-reflection capability of the display panel. At the same time, in comparison to a conventional polarizer structure, the extinction structure of the embodiment of the present disclosure has a smaller thickness, which is beneficial to realize a thin and light design of the display panel.

An embodiment of the present disclosure also provides a display device. The display device includes the organic light emitting diode display panel provided in the embodiments of the present disclosure. The display device may be a device with a display function, such as a tablet computer, a monitor, a television, and a mobile phone. The display device of the embodiment of the present disclosure has better anti-reflective performance, so that a displayed image is not disturbed by external light, has high definition, and has a good user experience. Also, the display device can realize a thin and light design.

Although certain embodiments and methods have been disclosed herein, it will be apparent from the foregoing disclosure to those skilled in the art that variations and modifications of such embodiments and methods may be made without departing from the spirit and scope of the disclosure. It is intended that the disclosure be defined by the appended claims.

What is claimed is:

1. An organic light emitting diode display panel, comprising:
   a display substrate comprising a plurality of pixel units, wherein at least some of the pixel units have different colors;
   a phase functional layer disposed on a display surface of the display substrate and comprising a plurality of phase retardation layers, wherein each of the phase retardation layers is disposed corresponding to one of the pixel units, and the phase retardation layers are configured to convert light passing therethrough from a linearly polarized light to a circularly polarized light; and
   an optical functional layer disposed on the phase functional layer, wherein the optical functional layer comprises a plurality of polarizing units, each of the polarizing units is disposed corresponding to one of the pixel units, and each of the polarizing unit is configured to convert light passing therethrough into a linearly polarized light with a color the same as that of a corresponding pixel unit.

2. The organic light emitting diode display panel as claimed in claim 1, wherein the phase retardation layers are configured to retard a phase of the light passing therethrough by a quarter wavelength.

3. The organic light emitting diode display panel as claimed in claim 1, wherein thicknesses of the phase retardation layers corresponding to the pixel units of different colors are different.

4. The organic light emitting diode display panel as claimed in claim 1, wherein a thickness of one of the phase retardation layers is less than 10 micrometers.

5. An organic light emitting diode display panel, comprising:
   a display substrate comprising a plurality of pixel units, wherein at least some of the pixel units have different colors; and
   a phase functional layer disposed on a display surface of the display substrate and comprising a plurality of phase retardation layers, wherein each of the phase retardation layers is disposed corresponding to one of the pixel units, and the phase retardation layers are configured to convert light passing therethrough from a linearly polarized light to a circularly polarized light, wherein the phase functional layer further comprises a first barrier disposed between two adjacent phase retardation layers, and the first barrier is configured to prevent light passing through one of the two adjacent phase retardation layers from entering another one of the two adjacent phase retardation layers.

6. The organic light emitting diode display panel as claimed in claim 5, wherein the first barrier is made of an opaque material, and a thickness of the first barrier is greater than a thickness of one of the phase retardation layers.

7. The organic light emitting diode display panel as claimed in claim 1, wherein each of the polarizing units comprises a linearly polarized light layer disposed on the phase functional layer and a color filter layer disposed on the linearly polarized light layer, and the color filter layer is configured to filter light passing therethrough into monochromatic light with a color the same as that of a corresponding pixel unit, and the linearly polarized light layer is configured to convert light passing therethrough into the linearly polarized light.

8. The organic light emitting diode display panel as claimed in claim 1, wherein each of the polarizing units comprises a color filter layer disposed on the phase functional layer and a linearly polarized light layer disposed on the color filter layer, and the color filter layer is configured to filter light passing therethrough into monochromatic light with a color the same as that of a corresponding pixel unit, and the linearly polarized light layer is configured to convert light passing therethrough into the linearly polarized light.

9. The organic light emitting diode display panel as claimed in claim 1, wherein the optical functional layer further comprises a second barrier disposed between two adjacent polarizing units, and the second barrier is configured to prevent light passing through one of the two adjacent polarizing units from entering another one of the two adjacent polarizing units.

10. The organic light emitting diode display panel as claimed in claim 9, wherein the second barrier is made of an opaque material, and a thickness of the second barrier is greater than a thickness of one of the polarizing units.

11. The organic light emitting diode display panel as claimed in claim 1, wherein the display substrate comprises a red pixel unit, a green pixel unit, and a blue pixel unit, and the phase functional layer comprises a red phase retardation layer corresponding to the red pixel unit, a green phase retardation layer corresponding to the green pixel unit, and a blue phase retardation layer corresponding to the blue pixel unit.

12. The organic light emitting diode display panel as claimed in claim 11, wherein a thickness of the red phase retardation layer, a thickness of the green phase retardation layer, and a thickness of the blue phase retardation layer are different.

13. The organic light emitting diode display panel as claimed in claim 11, wherein the optical functional layer comprises a red polarizing unit corresponding to the red pixel unit, a green polarizing unit corresponding to the green pixel unit, and a blue polarizing unit corresponding to the blue pixel unit.

14. The organic light emitting diode display panel as claimed in claim 13, wherein a thickness of the red polarizing unit, a thickness of the green polarizing unit, and a thickness of the blue polarizing unit are different.

15. The organic light emitting diode display panel as claimed in claim 1, further comprising a first planarization layer, a touch functional layer, a second planarization layer, and a cover plate, wherein the first planarization layer is disposed on the phase functional layer, the touch functional layer is disposed between the first planarization layer and the optical functional layer, the second planarization layer is disposed on the optical functional layer, and the cover plate is disposed on the second planarization layer.

16. The organic light emitting diode display panel as claimed in claim 1, wherein the display substrate further comprises a flexible substrate, an array layer disposed on the flexible substrate, and a thin film encapsulation layer disposed on the pixel units; and
   the pixel units are disposed between the array layer and the thin film encapsulation layer.

17. A display device, comprising an organic light emitting diode display panel, wherein the organic light emitting diode display panel comprises:
   a display substrate comprising a plurality of pixel units, wherein at least some of the pixel units have different colors;
   a phase functional layer disposed on a display surface of the display substrate and comprising a plurality of phase retardation layers, wherein each of the phase retardation layers is disposed corresponding to one of the pixel units, and the phase retardation layers are configured to convert light having a linearly polarized light to a circularly polarized light; and an optical functional layer disposed on the phase functional layer, wherein the optical functional layer comprises a plurality of polarizing units, each of the polarizing units is disposed corresponding to one of the pixel units, and each of the polarizing unit is configured to convert light passing therethrough into a linearly polarized light with a color the same as that of a corresponding pixel unit.

18. The display device as claimed in claim 17, wherein the display substrate comprises a red pixel unit, a green pixel unit, and a blue pixel unit;

the phase functional layer comprises a red phase retardation layer corresponding to the red pixel unit, a green phase retardation layer corresponding to the green pixel unit, and a blue phase retardation layer corresponding to the blue pixel unit; and the optical functional layer comprises a red polarizing unit corresponding to the red pixel unit, a green polarizing unit corresponding to the green pixel unit, and a blue polarizing unit corresponding to the blue pixel unit.

\* \* \* \* \*